(12) United States Patent
Liu

(10) Patent No.: US 9,474,048 B2
(45) Date of Patent: Oct. 18, 2016

(54) DEVICE, METHOD, MOBILE COMMUNICATION TERMINAL, COMPUTER PROGRAM AND STORAGE MEDIUM FOR FREQUENCY CONTROL

(75) Inventor: Junying Liu, Beijing (CN)

(73) Assignee: ST-ERICSSON SA, Plan-les-Ouates (CH)

(*) Notice: Subject to any disclaimer, the term of this patent is extended or adjusted under 35 U.S.C. 154(b) by 7 days.

(21) Appl. No.: 14/359,329

(22) PCT Filed: Nov. 23, 2011

(86) PCT No.: PCT/CN2011/082739
§ 371 (c)(1),
(2), (4) Date: May 21, 2014

(87) PCT Pub. No.: WO2013/075301
PCT Pub. Date: May 30, 2013

(65) Prior Publication Data
US 2014/0315568 A1    Oct. 23, 2014

(51) Int. Cl.
*H04W 72/02* (2009.01)
*H04W 88/06* (2009.01)
*H03J 7/04* (2006.01)
*H04W 48/16* (2009.01)

(52) U.S. Cl.
CPC .............. *H04W 72/02* (2013.01); *H03J 7/04* (2013.01); *H04W 48/16* (2013.01); *H04W 88/06* (2013.01)

(58) Field of Classification Search
CPC ... H04W 72/02; H04W 48/16; H04W 88/06; H03J 7/04; H04M 1/72522
See application file for complete search history.

(56) References Cited

U.S. PATENT DOCUMENTS

| | | | |
|---|---|---|---|
| 2008/0125118 A1* | 5/2008 | Ormson | 455/434 |
| 2012/0179885 A1* | 7/2012 | Wade et al. | 711/162 |
| 2012/0309334 A1* | 12/2012 | Raza et al. | 455/161.3 |

FOREIGN PATENT DOCUMENTS

| | | |
|---|---|---|
| CN | 1909386 A | 2/2007 |
| CN | 101150819 A | 3/2008 |
| CN | 102045082 A | 5/2011 |

* cited by examiner

*Primary Examiner* — Marcos Torres
(74) *Attorney, Agent, or Firm* — Coats & Bennett, PLLC

(57) ABSTRACT

The present invention relates to devices, methods, mobile communication terminals, computer programs and storage mediums for frequency control. The frequency control device for a mobile communication terminal only uses one crystal oscillator, but can access different access networks at the same time. The frequency control device may control the output of the crystal oscillator based on a plurality of frequency offset estimation results and the service performance of access network corresponding to the frequency offset estimation results. Therefore, the flexibility of frequency offset control may be improved and better service may be provided to users.

17 Claims, 6 Drawing Sheets

DEVICE, METHOD, MOBILE COMMUNICATION TERMINAL, COMPUTER PROGRAM AND STORAGE MEDIUM FOR FREQUENCY CONTROL

BACKGROUND OF THE INVENTION

1. Field of the Invention

The present invention relates to mobile communication technology, especially relates to devices, methods, mobile communication terminals, computer programs and storage mediums for frequency control.

2. Description of the Prior Art

With the development of mobile communication technology, a plurality of access networks, such as GSM access network, TD-SCDMA access network, WCDMA access network and TD-LTE access network coexist in the conventional mobile communication systems.

Various access networks have different advantages exemplified as follows: network coverage of GSM access network is broader so as to provide better voice call service to users; the network speed of TD-SCDMA access network or WCDMA access network is faster so as to provide high-speed data service to users; while LTE access network can provide even higher-speed service with low delay so as to provide high-definition sound in real time and high-speed data service to users.

In order to fully utilize advantages of various access networks, there is a trend to integrate a plurality of network access techniques in a same operator network. Therefore, user can use one mobile communication terminal to access different access networks. Moreover, different services can be provided through different access networks.

In prior arts, in order to reduce costs, there is a mobile communication terminal which only uses one crystal oscillator and can access different access networks at the same time. The patent document, with application No. 200910201610.7, published as CN102045082A, applicant being Spreadtrum Communications (ShangHai) Inc., discloses a dual standby terminal and control method of automatic frequency control loop thereof.

The dual standby terminal disclosed by the above patent document is shown in FIG. 1, and comprises:

Two RF transceivers 10;

Antennas 11 each corresponding to a different RF transceiver 10;

The signals received by RF transceivers 10 are firstly AD (Analog-to-Digital) converted by an ADC 131 in a baseband processor 13. FO (Frequency Offset) estimation module 132 is used to estimate frequency offsets based on the AD converted signals so that each FO estimation result can be obtained.

A FO selection control module 133 determines a final frequency control signal based on two FO estimation results. A DAC module 134 implements a DA (Digital-to-Analog) conversion on the final frequency signal and outputs the DA converted final frequency signal to an Oscillator 12 so as to control the output frequency of Oscillator 12.

In the above dual standby terminal, FO selection control unit 133 may either utilize the average of the two FO estimation results to determine the final frequency control signal, or use the service status of the system or randomly select one FO estimation result to determine the final frequency control signal.

In the above dual standby terminal and the control method of the automatic frequency control loop thereof, the two FO estimation results are averaged or one of the two FO estimation results is selected, the flexibility is low and service performance can not be guaranteed accordingly.

SUMMARY OF THE INVENTION

The embodiment of the present invention discloses devices, methods, mobile communication terminals, computer programs and storage mediums for frequency control. A practical frequency offset control scheme is provided, wherein the mobile communication terminal only uses one crystal oscillator, but can access different access networks at the same time.

In some embodiments of the present invention, the mobile communication terminal controls output frequency of a crystal oscillator based on frequency offset estimation results and service performance value of access network.

The embodiments of the present invention set weights of the frequency offset estimation results based on service performance parameters of access network. A final frequency offset estimation result for frequency automatic control may be further determined based on the weights and the actual values of the frequency offset estimation results. The output frequency of the crystal oscillator may be controlled based on the final frequency offset estimation result.

During the whole frequency control process, the weights of the frequency offset estimation results corresponding to access networks change dynamically as the service performance of access networks changes. Thus the frequency control scheme according to the embodiments of the present invention may adaptively follow the change of network environment.

In some embodiments of the present invention, a weight of a frequency offset estimation result may be related to the service performance. The higher the service performance value of access network is, the larger the weight of frequency offset estimation result corresponding to access network is. Thus the frequency offset estimation result corresponding to the access network with higher service performance value may affect the final frequency control signal more.

In some embodiments of the present invention, higher service performance value may mean that a service with better quality, such as higher bit rate or higher SNR, may be achieved.

In some embodiments of the present invention, for example, frequency control signal may be a frequency control word.

In some embodiments of the present invention, a plurality of frequency offset estimation results are obtained during the mobile communication terminal being powered on to access a plurality of access networks. When some embodiments of the present invention are applied to a power on process, since the weight of the frequency offset estimation result corresponding to the access network with higher service performance value is larger, compared with the access network with lower service performance value, the mobile communication terminal may search and reside in a cell of the access network with higher service performance value in a speedy manner. The time duration cost by the mobile communication terminal from powered on to providing better communication services to users may be shortened as a result.

When some embodiments of the present invention are applied to a service process after powered on, since the frequency offset estimation result corresponding to the access network with better service performance has a larger weight, the frequency control process makes the stability of a mobile communication terminal residing in a cell of the access network with higher service performance better than the stability of a mobile communication terminal residing in a cell of the access network with lower service performance value, which is conducive for providing better services to users.

In some embodiments of the present invention, the service performance parameters of access network may be various parameters. However, by considering the convenience of implementation, the service performance parameters of access network may adopt parameters such as signal power (e.g. measured received signal power) and/or signal to noise ratio (e.g. measured received signal to noise ratio), which may be measured by a mobile communication terminal per se. It may lower the implementation difficulty and cost of frequency control scheme according to the embodiments of the present invention.

By considering that different access networks may require different frequency control periods, in some embodiments of the present invention, the frequency control period in the frequency control scheme may be the minimum one among all automatic frequency control periods corresponding to the plurality of access networks so as to meet the requirements of the frequency control periods of all access networks at the same time.

It should be appreciated that the present invention is not limited to the above features and advantages. A person skilled in the art may devise other features and advantages which also fall into the protection scopes of the present invention, by reading the detail description of the preferred embodiments in conjunction with the accompanying figures.

BRIEF DESCRIPTION OF THE DRAWINGS

FIG. 5 shows a schematic flow chart for selecting only one access network to implement a cell searching when a dual standby terminal powers on;

FIG. 6 shows a schematic flow chart for selecting both access networks at the same time to implement a cell searching when the dual standby terminal powers on.

DETAILED DESCRIPTION OF THE PREFERRED EMBODIMENTS

In devices, methods, mobile communication terminals, computer programs and storage mediums for frequency control according to a specific embodiment of the present invention, the mobile communication terminal which may access different access networks at the same time may control the output of only one crystal oscillator according to a plurality of frequency offset estimation results and the service performance of the access network corresponding to the frequency offset estimation results. Therefore, the flexibility of frequency offset control may be improved and better service may be provided to users.

A mobile communication terminal which is provided with the frequency control device according embodiments of the present invention only uses one crystal oscillator, but can access a plurality of access networks.

Figure 1:
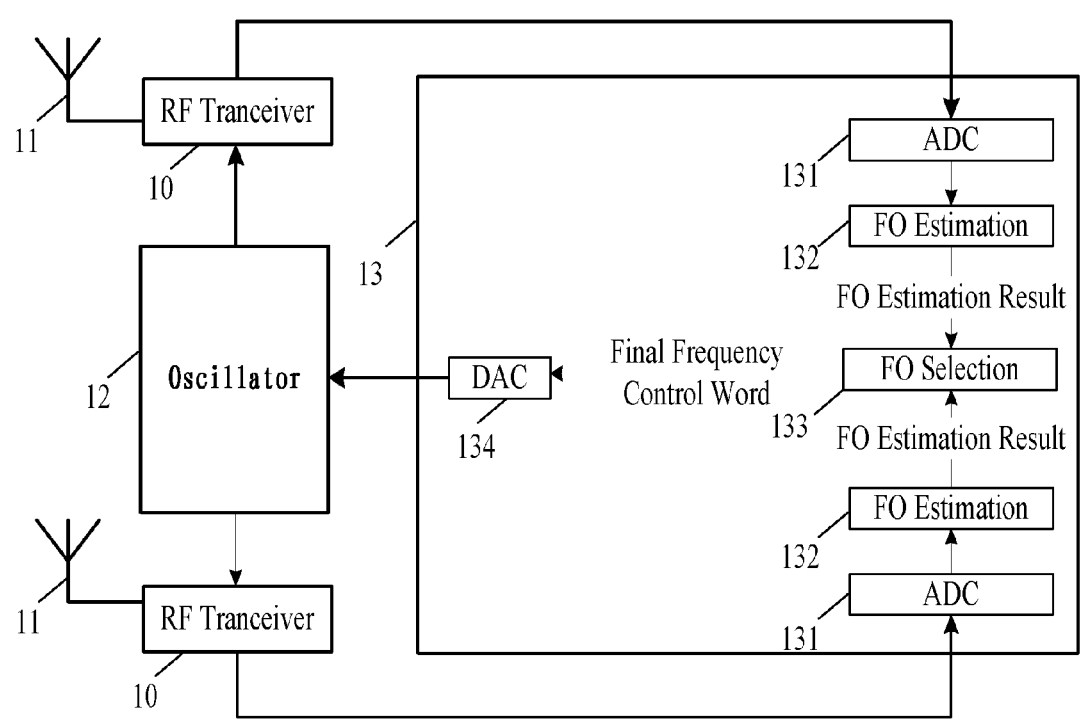
FIG. 1 shows a schematic structure diagram of a mobile communication terminal according to prior arts.
Figure 2:
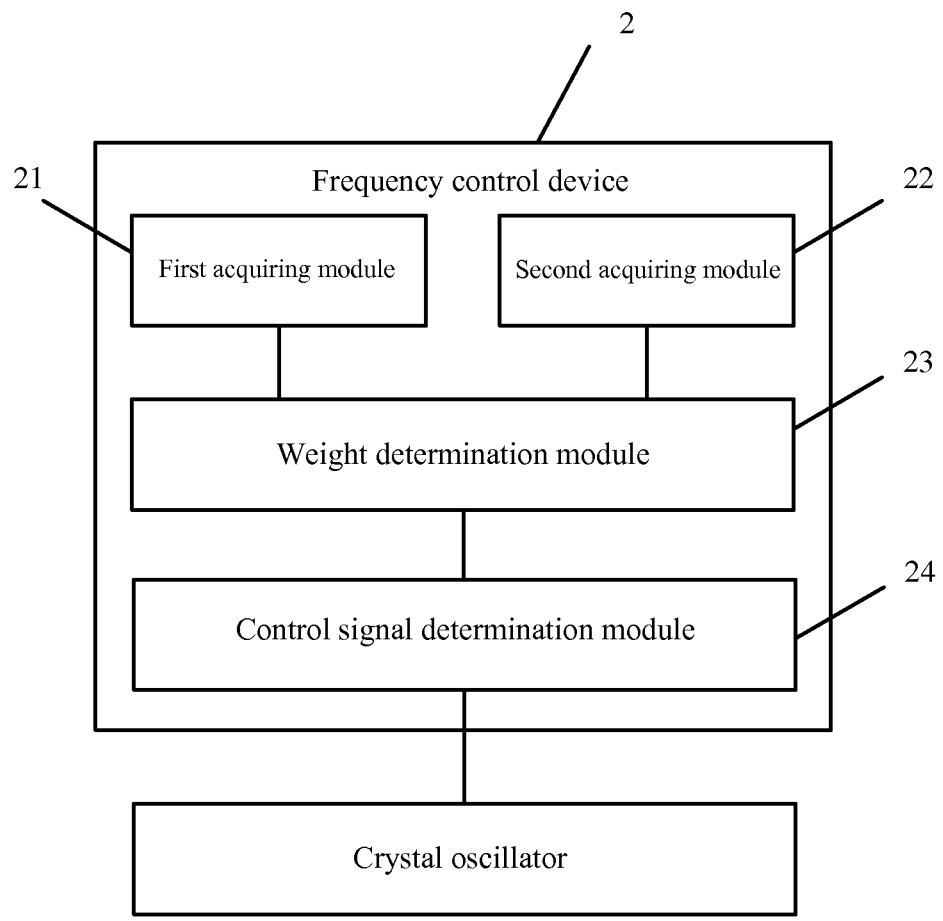
FIG. 2 shows a schematic structure diagram of a frequency control device according to a specific embodiment of the present invention.

As shown in FIG. 2, a frequency control device 2 includes: a first acquiring module 21, a second acquiring module 22, a weight determining module 23 and a control signal determining module 24.

First acquiring module 21 acquires a plurality of frequency offset estimation results respectively corresponding to the plurality of access networks. And second acquiring module 22 acquires service performance parameters of each access network among the plurality of access networks.

After acquiring the frequency offset estimation result and at least one service performance parameter of each access network, weight determining module 23 determines a weight of each frequency offset estimation result among a plurality of frequency offset estimation results based on the service performance parameters of access network corresponding to each frequency offset estimation result.

In some embodiments of the present invention, the weight of each frequency offset estimation result is typically larger than 0 and smaller than 1, and a sum of all the weights is typically equal to 1.

Since the weight is larger than 0 and smaller than 1 in embodiments of the present invention, each frequency offset estimation result may affect the generation of the final frequency control signal. In some embodiments of the invention, no frequency offset estimation result is neglected.

After the weight determination, control signal determining module 24 calculates a final frequency offset estimation result based on the plurality of frequency offset estimation results and their corresponding weights, and determines the frequency control signal used for controlling the output frequency of the oscillator based on the final frequency offset estimation result.

In some embodiments of the present invention, frequency control signal may be a frequency control word.

In the embodiments of the present invention, the plurality of access networks may be GSM access network, CDMA access network, WCDMA access network, TD-SCDMA access network, CDMA 2000 access network and other existing access networks. The embodiments of the present invention may also be used for future various access networks.

In the embodiments of the present invention, a rule for determining a weight of a frequency offset estimation result may be:

When the first service performance of the first access network corresponding to the first frequency offset estimation result is higher than the second service performance of the second access network corresponding to the second frequency offset estimation result, the first weight of the first frequency offset estimation result is higher than the second weight of the second frequency offset estimation result.

An illustrative rule for determining a weight of a frequency offset estimation result is: the higher a service performance of an access network corresponding to a frequency offset estimation result is, the larger a weight of the frequency offset estimation result is. In other words, when a first service performance of a first access network corresponding to a first frequency offset estimation result is larger than a second service performance of a second access network corresponding to a second frequency offset estimation result, a first weight of the first frequency offset estimation result is higher than a second weight of the second frequency offset estimation result.

Certainly, in the specific embodiments of the present invention, by considering measurement errors, the rule for determining a weight of a frequency offset estimation result may be:

When an absolute value of a difference between the first service performance and the second service performance is larger than a service performance threshold, the first weight of the first frequency offset estimation result is higher than the second weight of the second frequency offset estimation result, otherwise the first weight equals to the second weight. Here, the first service performance is the service performance of the first access network corresponding to the first frequency offset estimation result, the second service performance is the service performance of the second access network corresponding to the second frequency offset estimation result.

In this case, when the service performance threshold is 0, in the specific embodiments of the present invention, the rule for determining a weight of a frequency offset estimation result may be simplified into the former weight determining rule, that is, the higher a service performance of an access network corresponding to a frequency offset estimation result is, the larger a weight of the frequency offset estimation result is.

In the specific embodiments of the present invention, the service performance parameter(s) of each access network among the plurality of access networks need to be obtained to calculate weights of the frequency offset estimation results.

The service performance parameter(s) may be various parameters each of which describes a service performance of an access network. The service performance parameter(s) may be obtained from outside of a mobile communication terminal. However, by considering the convenience and cost of implementation, in the specific embodiments of the present invention, service performance parameter(s) of an access network may adopt signal power of an access network and/or SNR (signal to noise ratio) of an access network which may be measured by a mobile communication terminal per se, any of them or both of them may be used as service performance parameter(s) for describing a service performance of an access network, such as:

The larger a signal power is, the higher a service performance of an access network is; or The higher a SNR is, the higher a service performance of an access network is.

Taking the signal power as an example, assuming a mobile communication terminal supports GSM access network and TD-SCDMA access network both, a final frequency offset estimation result $f_{final}$ obtained by the embodiments of the present invention may be described by the following formula:

$$f_{final} = a*f_1 + b*f_2$$

where $f_1$ is a frequency offset estimation result corresponding to GSM access network, $f_2$ is a frequency offset estimation result corresponding to TD-SCDMA access network, a is a weight of $f_1$, and b is a weight of $f_2$.

Assuming that $P_1$ is a signal power corresponding to GSM access network, $P_2$ is a signal power corresponding to TD-SCDMA access network, a power threshold is $\delta$, the rule for determining weights of frequency offset estimation results may be described by the following formula:

$$\begin{cases} 1 > a > b > 0, P_1 - P_2 > \delta \\ 0 < a < b < 1, P_2 - P_1 > \delta \\ a = b = 0.5, |P_1 - P_2| \leq \delta \\ a + b = 1 \end{cases}$$

The value of $\delta$ may be set according to the specific situations, for example, if a measurement error is relatively small, the value of $\delta$ may be set as a small value; if a measurement error is relatively large, the value of $\delta$ may be set as a large value.

In the specific embodiments of present invention, the unit of $P_1$ and $P_2$ may be dBm, and the unit of $\delta$ may be dB. On the other hand, when the unit of $P_1$ and $P_2$ is mw, the above formula may be described as below:

$$\begin{cases} 1 > a > b > 0, P_1/P_2 > 10^{\delta/10} \\ 0 < a < b < 1, P_2/P_1 > 10^{\delta/10} \\ a = b = 0.5, 10^{-\delta/10} \leq |P_1/P_2| \leq 10^{\delta/10} \\ a + b = 1 \end{cases}$$

In the specific embodiments of present invention, since the above signal power and the SNR may be measured by the mobile communication terminal itself, it will not be explained in detail here. Any suitable future or known measurement and/or estimation method may be used.

In the specific embodiments of present invention, two or more power thresholds can be set to determine the weight parameters a and b. Take two thresholds $\delta_1$ and $\delta_2$ for example, the rule for determining weights of frequency offset estimation results may be described by the following formula:

$$\begin{cases} 1 > a \geq 0.5 + \Delta_1, P_1 - P_2 > \delta_1 \\ 0.5 + \Delta_1 > a > 0.5, \delta_1 \geq P_1 - P_2 > \delta_2 \\ 1 > b \geq 0.5 + \Delta_1, P_2 - P_1 > \delta_1 \\ 0.5 + \Delta_1 > b > 0.5, \delta_1 \geq P_2 - P_1 > \delta_2 \\ a = b = 0.5, |P_1 - P_2| \leq \delta_2 \\ a + b = 1 \end{cases}$$

It can be found that the above two formulas only describes the range of values of the weight parameters a and b, and a number of actual values of a and b may be infinite. Take the first formula for example, when $P_1-P_2>\delta$, a list of possible values of a and b may be derived:

a=3/5 and b=2/5; or
a=4/7 and b=3/7; or
a=5/9 and b=4/9; or
......

The specific embodiments of the present invention may determine a specific value of a weight of a frequency offset estimation result through various methods. A detailed explanation of examples will be described by taking the signal power as an example.

<Weight Determination Method No. 1>

In weight determination method No. 1, the weight may be determined according to the percentage of service performance parameters (signal powers), which will be explained as follow:

It is assumed that a mobile communication terminal supports n kinds of access networks, i.e., A1, A2, . . . , An, the actually measured signal powers of access networks A1, A2, ..., An are respectively $P_1, P_2, ..., P_n$, then the weights of frequency offset estimation results $f_1, f_2, ..., f_n$ corresponding to access networks A1, A2, ..., An are respectively:

$P_1/(P_1+P_2+ ... +P_n), P_2/(P_1+P_2+ ... +P_n), ..., P_n/(P_1+P_2+ ... +P_n)$.

The weights of results $f_1, f_2, ..., f_n$ are all larger than 0 and smaller than 1, and a sum of the weights of results $f_1, f_2, ..., f_n$ is 1.

<Weight Determination Method No. 2>

In weight determination method No. 2, a plurality of different weight values may be preset. A number of preset weight values may be the same with a number of access networks. All weight values are larger than 0 and smaller than 1. A sum of all weight values is 1.

After measuring signal powers of access networks, some preset weight values may be assigned to frequency offset estimation results, which will be exemplified in detail in the following:

It is assumed that a mobile communication terminal supports n kinds of access networks i.e., A1, A2, ..., An, the preset n weights are respectively $W_1, W_2, ..., W_n$, wherein, $0 > W_1 > W_2 > ... > W_n > 1$ and $W_1 + W_2 + ... + W_n = 1$ It is assumed that actually measured signal powers of access networks A1, A2, ..., An are respectively $P_1, P_2, ..., P_n$, wherein, $P_1 > P_3 > ... > P_2 > P_4$ The access networks are firstly rearranged in a descending order, i.e., in a order from high power to low power:

A1, A3, ..., A2, A4

Then $W_1, W_2, ... W_n$ are sequentially assigned to the frequency offset estimation results corresponding to the access networks in the stated order, that is:

Since access network A1 has the largest signal power, a weight of frequency offset estimation result $f_1$ corresponding to access network A1 is $W_1$ which is the largest among $W_1, W_2, ..., W_n$.

Since access network A3 has the second largest signal power, a weight of frequency offset estimation result $f_3$ corresponding to access network A3 is $W_2$ which is the second largest among $W_1, W_2, ..., W_n$.

The same principle is applied to all networks and is finalized as follows.

Since access network A4 has the smallest signal power, a weight of frequency offset estimation result $f_4$ corresponding to access network A4 is $W_n$ which is the smallest among $W_1, W_2, ..., W_n$.

Certainly, the above weight determination methods are only used for illustration. The embodiments of the present invention are not limited to the above weight distribution methods.

Figure 3:
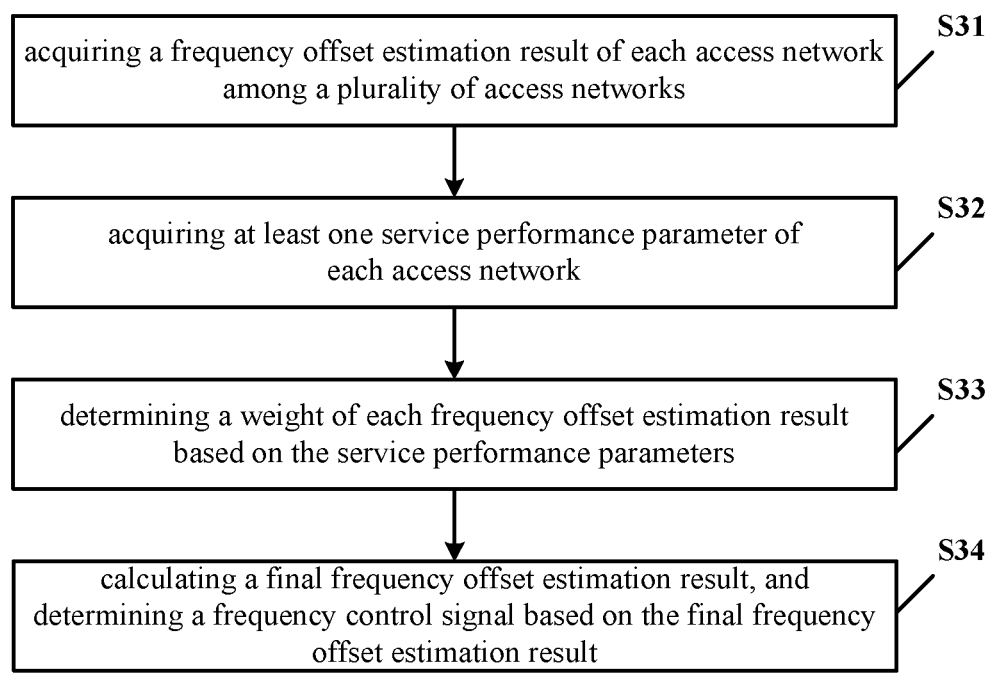
FIG. 3 shows a schematic flow chart of a frequency control method according to a specific embodiment of the present invention.

The frequency control method according to the embodiments of the present invention only uses one crystal oscillator, but can access mobile communication terminals of a plurality of access networks. The frequency control method is shown in FIG. 3 and includes:

Step S31, acquiring a frequency offset estimation result of each access network among a plurality of access networks;

Step S32, acquiring at least one service performance parameter of each access network among the plurality of access networks;

Step S33, determining a weight of each frequency offset estimation result among a plurality of frequency offset estimation results based on the service performance parameters of an access network corresponding to each frequency offset estimation result;

Step S34, calculating a final frequency offset estimation result based on the plurality of frequency offset estimation results and the weight of each frequency offset estimation result, and determining a frequency control signal used for controlling an output frequency of an oscillator based on the final frequency offset estimation result.

Figure 4:
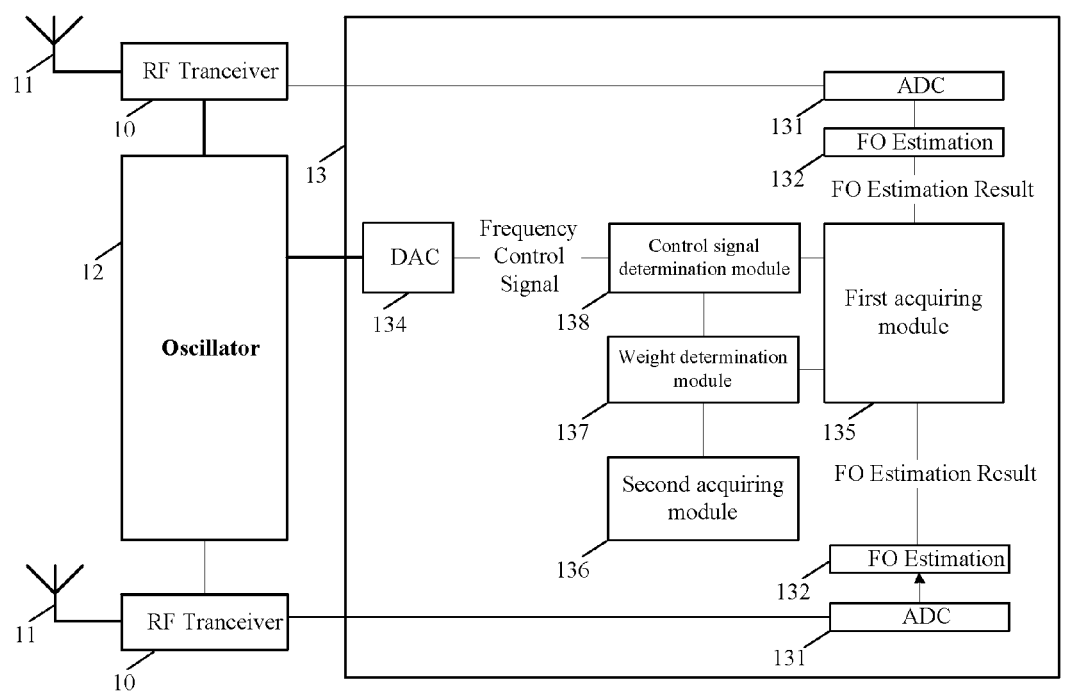
FIG. 4 shows a schematic structure diagram of a mobile communication terminal according to a specific embodiment of the present invention.

A mobile communication terminal according to the embodiments of the present invention is shown in FIG. 4 and includes:

a plurality of transceivers 10;

antennas 11 each of which corresponds to a different transceiver 10;

a crystal oscillator 12 respectively connected with a plurality of transceivers 10;

ADCs 131 each of which corresponds to a different transceiver 10;

frequency offset estimation modules 132 each of which corresponds to a different transceiver 10;

a first acquiring module 135 configured to acquire a plurality of frequency offset estimation results respectively corresponding to the plurality of access networks which are obtained from the frequency offset estimation by frequency offset estimation module 132;

a second acquiring module 136 configured to acquire service performance parameter(s) of each access network among the plurality of access networks;

a weight determining module 137 configured to determine a weight of each frequency offset estimation result among a plurality of frequency offset estimation results based on the service performance parameters of access network corresponding to each frequency offset estimation result;

wherein an example rule for determining the weight of each frequency offset estimation result may be that: when an absolute value of a difference between the service performance of the first access network corresponding to the first frequency offset estimation result and the service performance of the second access network corresponding to the second frequency offset estimation result exceeds the preset service performance threshold, the first weight of the first frequency offset estimation result is higher than the second weight of the second frequency offset estimation result, otherwise the first weight equals to the second weight; and a control signal determining module 138 configured to calculate a final frequency offset estimation result based on the plurality of frequency offset estimation results and their corresponding weights, and determine a frequency control signal used for controlling the output frequency of the oscillator based on the final frequency offset estimation result.

The frequency control signal is converted into analog signal by DAC 134 and sent to Oscillator 12. Oscillator 12 adjusts the output frequency under the control of the analog frequency control signal.

FIG. 4 only shows two RF transceivers. It should be appreciated that the embodiments of the present invention may use more than two RF transceivers.

The embodiments of the present invention achieves the following advantageous effects:

Each time a mobile communication terminal implements automatic frequency control, a weight of each frequency offset estimation result in this output frequency control process may be determined based on the current service performance parameter(s) of access networks, and the determined weights may be used to calculate a frequency control signal in this output frequency control process. The weights of the frequency offset estimation results may be related to the service performance. The higher service performance of an access network is, the larger a weight of the frequency offset estimation result corresponding to the access network is. During each automatic frequency control process, the above weight determination mechanism enables the frequency offset estimation result corresponding to the access network with higher service performance to affect the final frequency control signal more.

In view of a power on process, since the weight of the frequency offset estimation result corresponding to the access network with higher service performance is larger, the method according to the embodiments of the present invention enables the convergence speed of the frequency automatic control process corresponding to the access network with higher service performance to increase. Compared with the method considering the average of all frequency offset estimation results and the method choosing only one frequency offset estimation result, the method according to the embodiments of the present invention enables a mobile communication terminal to reside in a cell of the access network with higher service performance as soon as possible. The time duration from being powered on to providing users services may be shortened as a result.

In view of the whole automatic frequency control process, during iteratively executed automatic frequency control process, the weight of the frequency offset estimation result in different phases corresponding to the same access network changes as the service performance of access network changes. Therefore, during the whole automatic frequency control process, the weight of the frequency offset estimation result corresponding to the same access network may not be invariable. Compared with a method with fixed weights, the method in which the weights may change as the service performance of access network changes may better adapt itself to the actual network change so as to provide more accurate automatic frequency control result.

Since the frequency offset estimation result corresponding to the access network with better service performance has larger weight, the frequency offset estimation result corresponding to the access network with better service performance effects the frequency control signal more, so that the output frequency of oscillator may be more coincident with the frequency of the access network with better service performance. Therefore, stability of the mobile communication terminal residing in a cell of the access network with better service performance will be maintained, which may be conducive to providing better service to users.

In the embodiments of the present invention, the crystal oscillator may be a Digitally-Compensated Xtal Oscillator (DCXO), a Voltage Controlled Temperature Compensated Xtal Oscillator (VC-TCXO), or other kinds of oscillator which can adjust output frequency based on the analog frequency control signal.

Although a mobile communication terminal supports a plurality of access networks, different access networks may require different frequency control period. In order to meet the requirements of the frequency control periods of all access networks, in the embodiments of the present invention, the frequency control period in the frequency control method may be the minimum one among all frequency control periods corresponding to a plurality of access networks.

Taking a mobile communication terminal supporting GSM access network and TD-SCDMA access network as an example, the frequency control period in the frequency control method may be set as min(T1, T2), wherein T1 and T2 represent the frequency adjusting period of GSM access network and TD-SCDMA access network respectively.

The methods, devices and mobile communication terminals according to the embodiments of the present invention may be used not only in a power on process, but also in a residing process after powered on.

During a residing process after being powered on, all transceivers may work at the same time. Frequency offset estimation modules 132 each of which corresponds to a respective transceiver may acquire a signal used for frequency offset estimation from the transceivers respectively. First acquiring module 135 may acquire a frequency offset estimation result of each of a plurality of access networks from all frequency offset estimation modules 132, further weight determination module 137 determines a weight of each frequency offset estimation result based on the service performance of access network, and finally control signal determination module 138 determines a frequency control signal based on the weights and the frequency offset estimation results.

During a power on process, in view of a mobile communication terminal supporting a plurality of access networks, searching may be simultaneously performed within the plurality of access networks after powered on so as to capture a cell and reside therein. During the subsequent searching to capture the cell and reside therein, since the transceivers corresponding to the plurality of access networks may simultaneously work as well, frequency offset estimation modules 132 each of which corresponds to a respective transceiver may acquire a signal used for frequency offset estimation from the transceivers respectively. The first acquiring module 135 may acquire a plurality of frequency offset estimation results respectively corresponding to the plurality of access networks from all frequency offset estimation modules 132, further weight determination module 137 may determine a weight of each frequency offset estimation result based on the service performance of access network, and finally control signal determination module 138 may determine a frequency control signal based on the weights and the frequency offset estimation results.

Taking a dual standby terminal (for the sake of convenience, two kinds of access networks are named access network A and access network B, respectively) as an example, an actual process of the method according to the embodiments of the present invention may be described as follows.

When a mobile communication terminal powers on, the mobile communication terminal will request access network selection so as to select at least one available access network. There are two kinds of access network selection: manual mode and automatic mode. Whatever access network is manually selected or automatically selected, there are two kinds of selection results: only selecting one of access networks and selecting both access networks.

Figure 5:
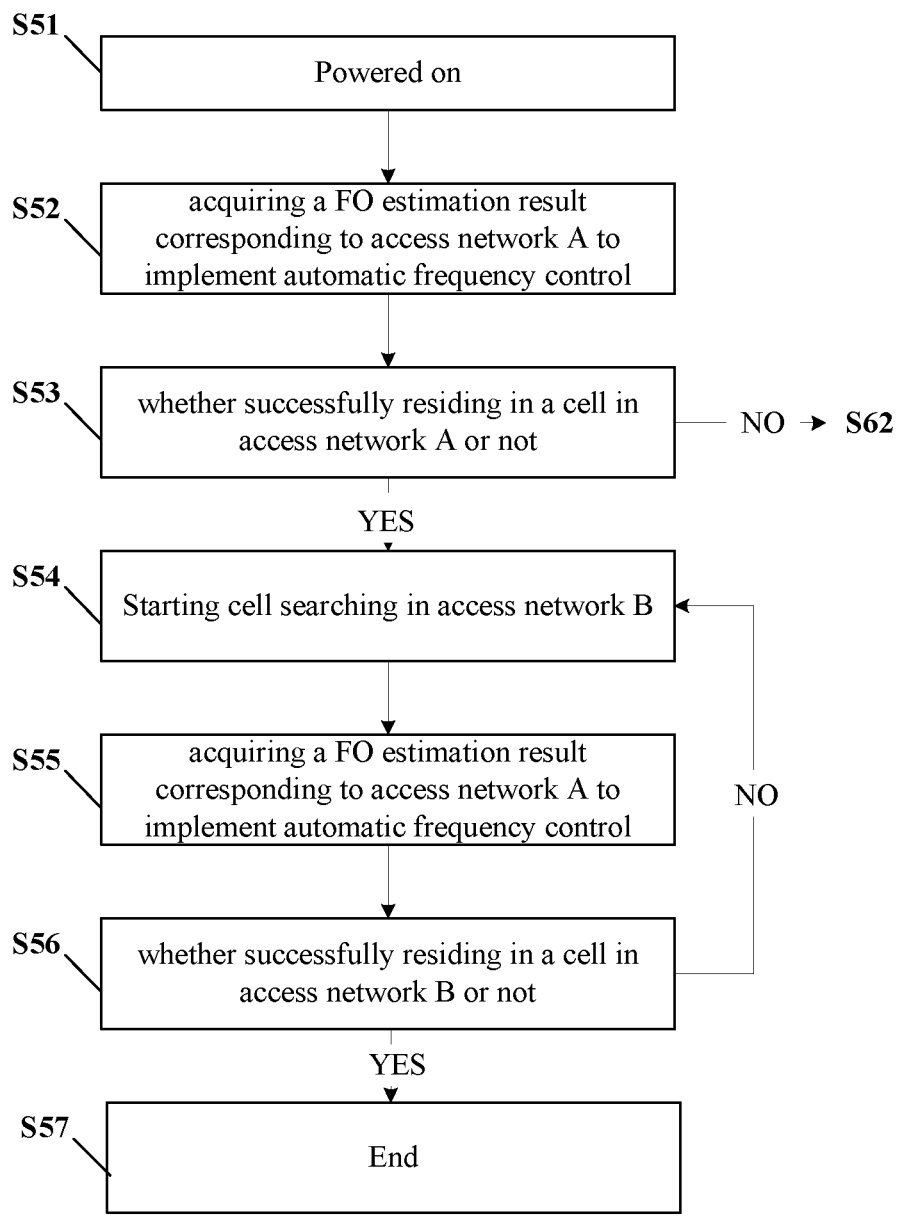

In the case of selecting one access network (assuming A), the corresponding processing procedure is shown in FIG. 5 and includes:

After a mobile communication terminal being powered on (Step S51), access network A may be selected to implement a cell searching. Meanwhile, the mobile communication terminal implements frequency offset estimation based on a signal received from network side by the transceivers, obtains a FO estimation result corresponding to access network A, and further implements automatic frequency control based on the FO estimation result corresponding to access network A (Step S52).

Figure 6:
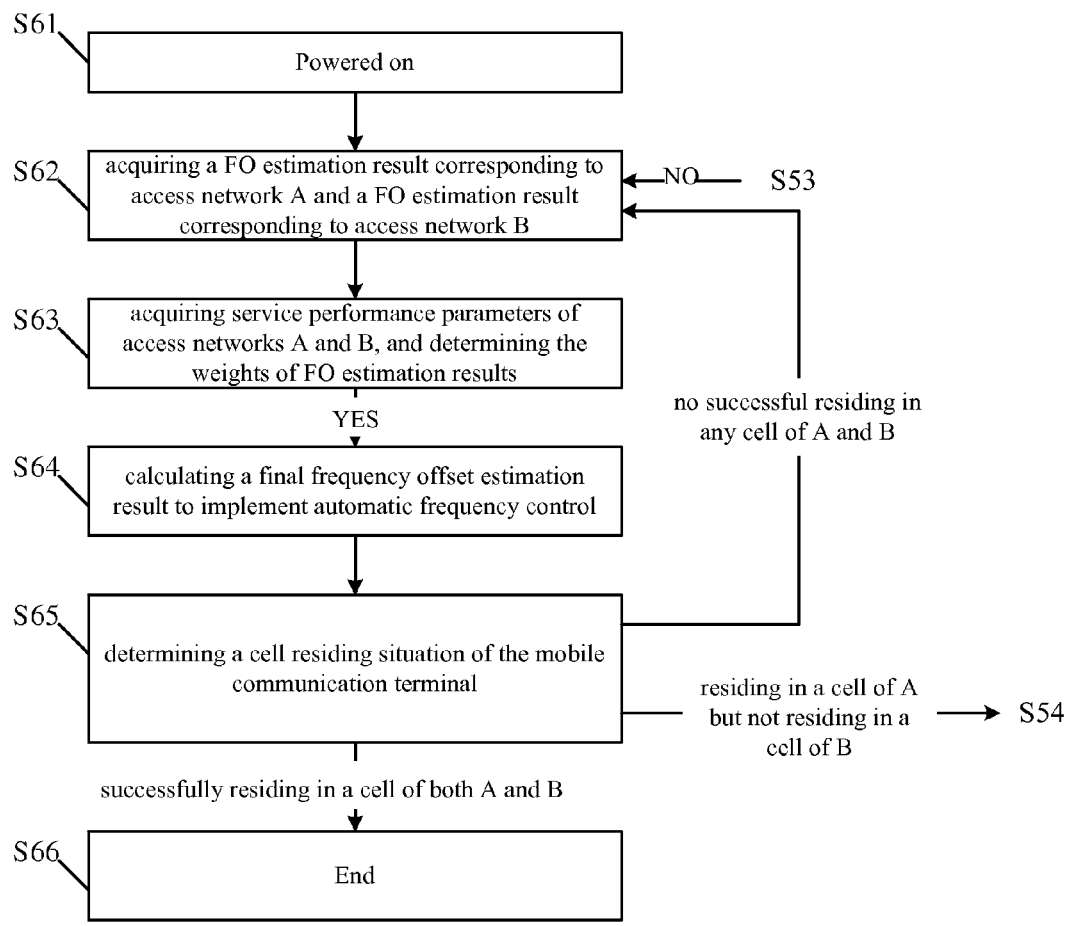

After automatic frequency control, determining whether the mobile communication terminal successfully resides in a cell in access network A or not (Step S53), if not, proceeding to Step S62 in FIG. 6, and implementing access by using the method of simultaneously selecting two access networks as shown in FIG. 6 according to the embodiments of the present invention, which will be described in detail as follows.

If successfully residing in a cell of access network A, then starting cell searching in access network B (Step S54). Since the mobile communication terminal has been resided in a cell of access network A, during cell searching in access network B, a FO estimation result corresponding to access network A may be directly used to implement automatic frequency control (Step S55).

After automatic frequency control, determining whether the mobile communication terminal successfully resides in a cell in access network B or not (Step S56), if not, retuning to Step S54 to continue cell searching. If yes, terminating the power on process and entering service status (Step S57).

If network B is never found, the mobile communication terminal can not reside in a cell of access network B successfully, then there appears an endless loop including Step 54-Step 55-Step 56. In some embodiments of the present invention, to avoid this endless loop, a times threshold may be set in advance. If a mobile communication terminal can not reside in any cell of access network B and a times of actual cell searching exceeds the times threshold, the cell residing will be terminated. The above is the explanation of starting cell searching with access network A, which is totally the same with starting cell searching with access network B. The latter situation will not be described in detail here.

In the case of selecting access networks A and B at the same time, the processing procedure is shown in FIG. 6 and includes:

After a mobile communication terminal being powered on (Step S61), or after unsuccessfully residing in a cell of any one access network, selecting access networks A and B to implement cell searching at the same time, implementing frequency offset estimation based on signals received from network sides of access networks A and B by transceivers at this time, obtaining a FO estimation result corresponding to access network A and a FO estimation result corresponding to access network B respectively (Step S62).

Obtaining service performance parameters of access networks A and B at the same time, determining weights of two FO estimation results based on the service performance parameters (Step S63).

Calculating a final frequency offset estimation result based on FO estimation results and their weights, implementing automatic frequency control based on the final frequency offset estimation result (Step S64); after automatic frequency control, determining cell residing situation of the mobile communication terminal (Step S65).

At this time, there are three kinds of cell residing situations of the mobile communication terminal, including:

Neither successfully residing in a cell of access network A nor successfully residing in a cell of access network B, then returning to Step S62 to continue the processing procedure;

Successfully residing in a cell of access network A or a cell of access network B, taking residing in a cell of access network A as an example, continuing the processing procedure by using the method of steps S54-S56, implementing cell searching in access network B according to a FO estimation result corresponding to access network A;

Successfully residing in a cell of access network A and a cell of access network B, after completing the power on process, entering service status (Step S66).

If networks A and B is never found, a mobile communication terminal can not reside in any cell of access networks A and B successfully, then there appears an endless loop including Step 62-Step 63-Step 64-Step 65. In some embodiments of the present invention, to avoid this endless loop, a times threshold can be set in advance. If a mobile communication terminal can not reside in any cell of access networks A and B and a times of actual cell searching exceeds the times threshold, the cell residing will be terminated.

The methods according to the embodiments of the present invention may be implemented in software and/or hardware. Therefore, the frequency control according to the embodiments of the present invention may be implemented by utilizing processing devices such as universal processor, signal processor and so on. The computer program includes program codes stored in computer readable medium. The program codes may be loaded and executed by a processor to implement the above methods.

In the embodiments of the present invention, a computer program, containing instructions, the computer program being loadable into a data-processing unit and adapted to cause execution of the frequency control method when the computer program is run by the data-processing unit.

In the embodiments of the present invention, a computer program product comprising a computer readable storage medium storing the computer program accordingly.

What is claimed is:

1. A frequency control method for a mobile communication terminal, the frequency control method comprising:
    acquiring a frequency offset estimation result of each of a plurality of different access networks having different performance parameters;
    acquiring at least one service performance parameter of each of the plurality of different access networks;
    determining a weight of each frequency offset estimation result based on the corresponding at least one service performance parameter;
    calculating a final frequency offset estimation result using the frequency offset estimation result acquired for each of the plurality of different access networks and the corresponding determined weight;
    determining a frequency control signal based on the final frequency offset estimation result; and
    controlling an output frequency of a crystal oscillator using the frequency control signal.

2. The frequency control method according to claim 1, wherein when a first service performance parameter of a first access network corresponding to a first frequency offset estimation result indicates a better performance than a second service performance parameter of a second access network corresponding to a second frequency offset estimation result, a first weight of the first frequency offset estimation result is higher than a second weight of the second frequency offset estimation result.

3. The frequency control method according to claim 1, wherein:
    when an absolute value of a difference between a first service performance parameter of a first access network corresponding to a first frequency offset estimation result and a second service performance parameter of a second access network corresponding to a second frequency offset estimation result is larger than a service performance threshold, a first weight of the first frequency offset estimation result is higher than a second weight of the second frequency offset estimation result; and otherwise the first weight equals the second weight.

4. The frequency control method according to claim 1, wherein the weight of each frequency offset estimation result is between 0 and 1, and a sum of all the weights equals 1.

5. The frequency control method according to claim 1, wherein each of the plurality of different access networks comprises a frequency control period defining a duration of the frequency control for the mobile communication terminal, and wherein a system frequency control period for the frequency control method comprises the minimum period among all of the frequency control periods.

6. The frequency control method according to claim 1, wherein the at least one service performance parameter comprises at least one of a signal power and a signal-to-noise ratio.

7. The method according to claim 1 wherein calculating the final frequency offset estimation result comprises:
 weighting the frequency offset estimation result acquired for each of the plurality of different access networks using the corresponding determined weight to determine a weighted frequency offset estimation result for each of the plurality of different access networks; and
 calculating the final frequency offset estimation result using the weighted frequency offset estimation result for each of the plurality of different access networks.

8. A frequency control device for a mobile communication terminal, the frequency control device comprising:
 a first acquiring circuit configured to acquire a frequency offset estimation result of each of a plurality of different access networks having different performance parameters;
 a second acquiring circuit configured to acquire at least one service performance parameter of each of the plurality of different access networks;
 a weight determination circuit configured to determine a weight of each frequency offset estimation result based on the corresponding at least one service performance parameter; and
 a control signal determination circuit configured to:
  calculate a final frequency offset estimation result using the frequency offset estimation result acquired for each of the plurality of different access networks and the corresponding determined weight;
  determine a frequency control signal based on the final frequency offset estimation result; and
  control an output frequency of a crystal oscillator using the frequency control signal.

9. The frequency control device according to claim 8, wherein when a first service performance parameter of a first access network corresponding to a first frequency offset estimation result indicates a better performance than a second service performance parameter of a second access network corresponding to a second frequency offset estimation result, a first weight of the first frequency offset estimation result is higher than a second weight of the second frequency offset estimation result.

10. The frequency control device according to claim 8, wherein:
 when an absolute value of a difference between a first service performance of a first access network parameter corresponding to a first frequency offset estimation result and a second service performance parameter of a second access network corresponding to a second frequency offset estimation result is larger than a service performance threshold, a first weight of the first frequency offset estimation result is higher than a second weight of the second frequency offset estimation result; and otherwise the first weight equals the second weight.

11. The frequency control device according to claim 8, wherein the weight of each frequency offset estimation result is between 0 and 1, and a sum of all the weights equals 1.

12. The frequency control device according to claim 8, wherein each of the plurality of different access networks comprises a frequency control period defining a duration of the frequency control for the mobile communication terminal, and wherein a system frequency control period for the frequency control device comprises the minimum period among all of the frequency control periods.

13. The frequency control device according to claim 8 wherein the at least one service performance parameter comprises at least one of a signal power and a signal-to-noise ratio.

14. The frequency control device according to claim 8 wherein the control signal determination circuit calculates the final frequency offset estimation result by:
 weighting the frequency offset estimation result acquired for each of the plurality of different access networks using the corresponding determined weight to determine a weighted frequency offset estimation result for each of the plurality of different access networks; and
 calculating the final frequency offset estimation result using the weighted frequency offset estimation result for each of the plurality of different access networks.

15. A mobile communication terminal, comprising:
 a plurality of transceivers, each corresponding to a different access network having different performance parameters;
 only one crystal oscillator operatively connected with the plurality of transceivers;
 frequency offset estimation circuits, each of which corresponds to a different one of the plurality of transceivers; and
 a frequency control device comprising:
  a first acquiring circuit configured to acquire a frequency offset estimation result of each of the plurality of different access networks;
  a second acquiring circuit configured to acquire at least one service performance parameter of each of the plurality of different access networks;
  a weight determination circuit configured to determine a weight of each frequency offset estimation result based on the corresponding at least one service performance parameter; and
  a control signal determination circuit configured to:
   calculate a final frequency offset estimation result using the frequency offset estimation result acquired for each of the plurality of different access networks and the corresponding determined weight;
   determine a frequency control signal based on the final frequency offset estimation result; and
   control an output frequency of the crystal oscillator using the frequency control signal.

16. The mobile communication terminal according to claim 15 wherein the control signal determination circuit calculates the final frequency offset estimation result by:
 weighting the frequency offset estimation result acquired for each of the plurality of different access networks using the corresponding determined weight to determine a weighted frequency offset estimation result for each of the plurality of different access networks; and calculating the final frequency offset estimation result using the weighted frequency offset estimation result for each of the plurality of different access networks.

17. A computer program product stored in a non-transitory computer readable medium for controlling a data-processing circuit of a mobile communication terminal, the computer program product comprising software instructions, which when run on the data processing circuit, causes the data processing circuit to:

acquire a frequency offset estimation result of each of a plurality of different access networks having different performance parameters;

acquire at least one service performance parameter of each of the plurality of different access networks;

determine a weight of each frequency offset estimation result based on the corresponding at least one service performance parameter;

calculate a final frequency offset estimation result using the frequency offset estimation result acquired for each of the plurality of different access networks and the corresponding determined weight;

determine a frequency control signal based on the final frequency offset estimation result; and control an output frequency of a crystal oscillator using the frequency control signal.

* * * * *